United States Patent
Tomioka et al.

(10) Patent No.: US 10,831,219 B2
(45) Date of Patent: Nov. 10, 2020

(54) VOLTAGE REGULATOR

(71) Applicant: ABLIC Inc., Chiba (JP)

(72) Inventors: Tsutomu Tomioka, Chiba (JP); Tadakatsu Kuroda, Chiba (JP); Masakazu Sugiura, Chiba (JP)

(73) Assignee: ABLIC INC., Chiba (JP)

( * ) Notice: Subject to any disclaimer, the term of this patent is extended or adjusted under 35 U.S.C. 154(b) by 142 days.

(21) Appl. No.: 16/289,189

(22) Filed: Feb. 28, 2019

(65) Prior Publication Data
US 2019/0302816 A1 Oct. 3, 2019

(30) Foreign Application Priority Data
Mar. 27, 2018 (JP) .................. 2018-060314

(51) Int. Cl.
*G05F 1/573* (2006.01)
*H02H 9/02* (2006.01)
*H03K 17/082* (2006.01)
*H02H 1/00* (2006.01)

(52) U.S. Cl.
CPC ........... *G05F 1/573* (2013.01); *H02H 1/0007* (2013.01); *H02H 9/02* (2013.01); *H02H 9/025* (2013.01); *H03K 17/0822* (2013.01)

(58) Field of Classification Search
CPC ........ H02H 9/002; H02H 9/025; G05F 1/573; H03K 17/0822
USPC ..................... 323/277; 361/18, 88, 92, 93.1
See application file for complete search history.

(56) References Cited

U.S. PATENT DOCUMENTS

| 5,677,558 | A  | * | 10/1997 | McGlinchey | ....... H01L 27/0623 |
| | | | | | 257/370 |
| 2003/0011952 | A1 | | 1/2003 | Fukui | |
| 2008/0170345 | A1 | * | 7/2008 | Tanabe | ............... H03K 17/0822 |
| | | | | | 361/79 |
| 2014/0184182 | A1 | * | 7/2014 | Yajima | .................... G05F 1/575 |
| | | | | | 323/273 |
| 2015/0055257 | A1 | * | 2/2015 | Azuma | ................... H02H 9/025 |
| | | | | | 361/18 |
| 2016/0241023 | A1 | * | 8/2016 | Bentley | .................. H02H 9/025 |
| 2017/0047836 | A1 | * | 2/2017 | Endo | ...................... G05F 1/575 |

FOREIGN PATENT DOCUMENTS

| JP | 2003-029856 A | 1/2003 |
| JP | 2005-191896 A | 7/2005 |

* cited by examiner

*Primary Examiner* — Gary A Nash
(74) *Attorney, Agent, or Firm* — Brinks Gilson & Lione

(57) ABSTRACT

A voltage regulator includes an error amplifier circuit which controls a gate voltage of an output transistor, an overcurrent protection circuit which prevents an overcurrent of the output transistor, and a protection circuit which detects a negative voltage of an output terminal and controls a gate voltage of the output transistor to suppress an overcurrent. The protection circuit includes a MOS transistor which controls the gate voltage of the output transistor, a clamp circuit connected to a gate of the MOS transistor, a semiconductor element having an N-type region connected to the clamp circuit, and a parasitic bipolar transistor constructed from an N-type region connected to the output terminal as an emitter, a P-type substrate as a base, and the N-type region of the semiconductor element as a collector.

7 Claims, 5 Drawing Sheets

VOLTAGE REGULATOR

RELATED APPLICATIONS

This application claims priority under 35 U.S.C. § 119 to Japanese Patent Application No. 2018-060314 filed on Mar. 27, 2018, the entire content of which is hereby incorporated by reference.

BACKGROUND OF THE INVENTION

1. Field of the Invention

The present invention relates to a voltage regulator.

2. Description of the Related Art

A voltage regulator generally includes an overcurrent protection circuit. Various inventions have been made to the protection circuit because accuracy is required for the protection circuit (refer to, for example, Japanese Patent Application Laid-Open No. 2003-29856).

FIG. 4 is a circuit diagram illustrating a voltage regulator having an overcurrent protection circuit in related art.

The voltage regulator in related art includes an error amplifier circuit 102 which receives a feedback voltage based on an output voltage of an output terminal 101 and a reference voltage, an output transistor 103, and an overcurrent protection circuit 104. Further, a transistor 108 being a protection element is provided at the output terminal 101.

The overcurrent protection circuit 104 includes a sense transistor 105 which monitors an output current of the output transistor 103, a level shift transistor 106 which makes operating conditions of the sense transistor 105 and the output transistor 103 equal, and a control circuit 107 which controls a gate voltage of the level shift transistor 106 in such a manner that drain voltages of the sense transistor 105 and the output transistor 103 become the same.

In the voltage regulator in related art, the overcurrent protection circuit having good accuracy is realized by taking such a circuit configuration as described above.

SUMMARY OF THE INVENTION

The voltage regulator in related art constructed as illustrated in FIG. 4 has a possibility of forming an NPN parasitic bipolar transistor in a P-type substrate by the existence of, for example, an N-type region of a drain of the transistor 108 connected to the output terminal 101, and an N-type region of a well of the level shift transistor 106.

FIG. 5 is a schematic cross-sectional view of a device structure including the transistors 105, 106, and 108 illustrated in FIG. 4. Here, the arrangement of the level shift transistor 106 makes a parasitic bipolar transistor 54 in which an N-type region 51 of the drain of the transistor 108 serves as an emitter, a P-type substrate 50 serves as a base, and N-type region(s) 52 and 53 of an NWELL of the level shift transistor 106 serve as a collector enter a state in which collector current is ready to flow.

The output terminal 101 may become a negative voltage depending on the condition of a load when a ground fault of the load occurs. That is, since the N-type region 51 of the drain of the NMOS transistor 108 becomes a negative voltage, the emitter of the parasitic bipolar transistor 54 becomes a negative voltage, so that base and collector currents flow through the parasitic bipolar transistor 54. Large current flows in the NMOS transistor 108. Since the collector current serves to pull out a drain current of the sense transistor 105, the overcurrent protection circuit 104 does not normally operate.

Since measures on layout such as increasing the distance between transistors, etc., are taken to avoid the above state, a constraint in layout is imposed, thereby causing the complexity of the layout, an increase in chip area, etc.

The present invention provides a voltage regulator having an overcurrent protection circuit which receives little constraint in layout and copes with malfunctions due to a parasitic bipolar transistor at the time of ground fault of an output terminal.

According to one aspect of the present invention there is provided a voltage regulator including: an error amplifier circuit configured to control a gate voltage of an output transistor with a voltage obtained by amplifying a difference between a voltage based on an output voltage supplied to an output terminal from the output transistor and a reference voltage; an overcurrent protection circuit configured to detect an overcurrent of the output transistor and control a gate voltage of the output transistor to prevent the overcurrent; and a protection circuit configured to detect a negative voltage of the output terminal and control the gate voltage of the output transistor to suppress an overcurrent, the protection circuit having a MOS transistor configured to control the gate of the output transistor, a clamp circuit connected to a gate of the MOS transistor, a semiconductor element having an N-type region connected to the clamp circuit, and a parasitic bipolar transistor in which an N-type region connected to the output terminal serves as an emitter, a P-type substrate serves as a base, and the N-type region of the semiconductor element serves as a collector.

Since a voltage regulator of the present invention includes a protection circuit which prevents an overcurrent when an output terminal becomes a negative voltage upon ground fault of a load, an overcurrent protection circuit can be constructed under little constraint in layout.

DETAILED DESCRIPTION OF THE PREFERRED EMBODIMENTS

Embodiments of the present invention will hereinafter be described with reference to the accompanying drawings.

Figure 1:
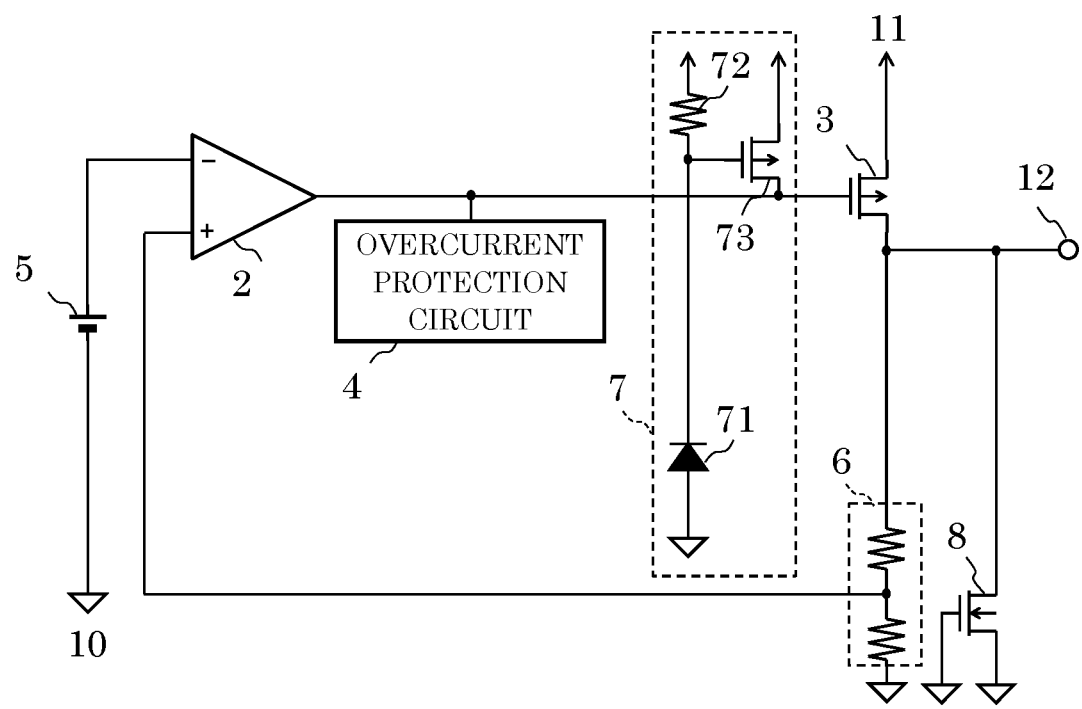
FIG. 1 is a circuit diagram illustrating a voltage regulator according to an embodiment of the present invention.

FIG. 1 is a circuit diagram illustrating a voltage regulator according to an embodiment of the present invention.

The voltage regulator according to the embodiment has an error amplifier circuit 2, a PMOS transistor 3 being an output transistor, an overcurrent protection circuit 4, a reference voltage circuit 5, a resistance circuit 6, a protection circuit 7, an NMOS transistor 8 being a clamp circuit, and an output terminal 12. The protection circuit 7 has a diode 71, a resistor 72, and a PMOS transistor 73. The NMOS transistor 8 is an ESD protection element. Although described later, the protection circuit 7 is constructed to include a drain region of the NMOS transistor 8.

A description will next be made of connections of the voltage regulator according to the embodiment.

The error amplifier circuit 2 has an inversion input terminal connected to a positive polarity terminal of the reference voltage circuit 5, and a non-inversion input terminal connected to an output terminal of the resistance circuit 6. The reference voltage circuit 5 has a negative polarity terminal connected to a ground terminal 10. The PMOS transistor 3 has a gate connected to an output terminal of the error amplifier circuit 2, a source connected to a power supply terminal 11, and a drain connected to the output terminal 12. The overcurrent protection circuit 4 and the protection circuit 7 are connected to the gate of the PMOS transistor 3. The resistance circuit 6 is connected between the output terminal 12 and the ground terminal 10. The NMOS transistor 8 has a gate and a source connected to the ground terminal 10, and a drain connected to the output terminal 12.

The diode 71 has a cathode connected to one terminal of the resistor 72, and an anode connected to the ground terminal 10. The resistor 72 has the other terminal connected to the power supply terminal 11. The PMOS transistor 73 has a gate connected to the cathode of the diode 71, a source connected to the power supply terminal 11, and a drain connected to the gate of the PMOS transistor 3.

The operation of the voltage regulator according to the embodiment will next be described.

When a power supply voltage VDD is applied to the power supply terminal 11, the PMOS transistor 3 provides the output voltage Vout from the output terminal 12. The error amplifier circuit 2 compares a reference voltage Vref of the reference voltage circuit 5 with a feedback voltage based on the output voltage Vout to control a gate voltage of the PMOS transistor 3 in such a manner that the feedback voltage approaches the reference voltage Vref.

When an overcurrent flows through the PMOS transistor 3 due to a short circuit of a load connected to the output terminal 12, etc., the overcurrent protection circuit 4 makes the gate voltage of the PMOS transistor 3 high to thereby protect the PMOS transistor 3 from the overcurrent. If, at this time, the output voltage Vout becomes negative, the overcurrent protection circuit 4 may not normally operate as described above.

Figure 2:
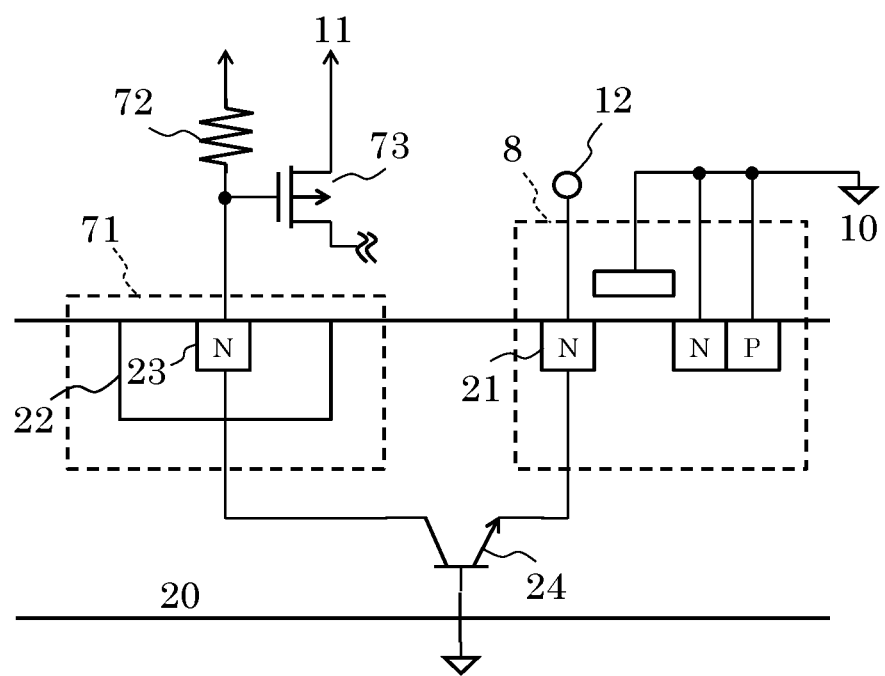
FIG. 2 is a schematic cross-sectional view of a device structure of the voltage regulator according to the embodiment.

FIG. 2 is a schematic cross-sectional view including a device structure of the protection circuit 7 of the voltage regulator according to the embodiment. The diode 71 is made from a P-type region of a P-type substrate 20 and N-type region(s) 22 and 23. The NMOS transistor 8 is constituted to include a drain of an N-type region 21 on the P-type substrate 20.

Here, a parasitic bipolar transistor 24 in which the N-type region 21 serves as an emitter, the P-type substrate 20 serves as a base, and the N-type region(s) 22 and 23 serve as a collector exists. That is, the protection circuit 7 is constructed from the parasitic bipolar transistor 24 in addition to the diode 71, the resistor 72, and the PMOS transistor 73.

The operation of the protection circuit 7 will next be described.

Since the voltage Vout of the output terminal 12 is controlled to be a desired voltage in a steady operation, the voltage Vout is higher than the voltage of the ground terminal 10. The base current and the collector current do not flow in the parasitic bipolar transistor 24 because the voltage of the emitter is higher than the voltage of the base. Thus, the PMOS transistor 73 turns off since the gate of the PMOS transistor 73 is clamped to the power supply voltage VDD of the power supply terminal 11.

When the voltage of the output terminal 12 becomes negative, the voltage of the N-type region 21 of the drain of the NMOS transistor 8 becomes negative. The voltage of the emitter of the parasitic bipolar transistor 24 hence becomes lower than that of the base, so that the base current and the collector current flow through the parasitic bipolar transistor 24. Flow of the collector current of the parasitic bipolar transistor 24 through the resistor 72 generates a voltage drop across the resistor 72. When the voltage of the gate of the PMOS transistor 73 is lowered to reach the threshold voltage, the PMOS transistor 73 turns on to supply drain current into the gate of the PMOS transistor 3 to raise the gate voltage. It is thus possible to reduce the gate-source voltage of the PMOS transistor 3 and thereby suppress the overcurrent of the PMOS transistor 3. As explained above the protection circuit detects the negative voltage of the output terminal 12 and increases the gate voltage of the PMOS transistor 3, suppressing the overcurrent of the PMOS transistor 3

Incidentally, the diode 71 may preferably be disposed closer to the NMOS transistor 8 than the N-type regions which constitute other circuits. Since such arrangement raises the current amplification factor of the parasitic bipolar transistor 24, sensitivity of the protection circuit 7 to the negative voltage of the output terminal also raises.

As described above, the protection circuit 7 in the embodiment is capable of, while being a simple circuit, controlling the gate voltage of the output transistor 3 to suppress an overcurrent when the voltage of the output terminal 12 becomes negative. Accordingly, even if the overcurrent protection circuit 4 does not normally operate, it is possible to reliably suppress the overcurrent. Since the overcurrent protection circuit 4 can be arranged with little constraint in layout, it is thus possible to eliminate complexity of the layout and an increase in chip area, etc.

Although the embodiments of the present invention have been described above, the present invention is not limited to the above embodiments. It is needless to say that various changes can be made thereto within the scope not departing from the spirit of the present invention.

For example, a current source or a diode-connected MOS transistor may be used for the resistor 72 which constitutes the clamp circuit.

Figure 3:
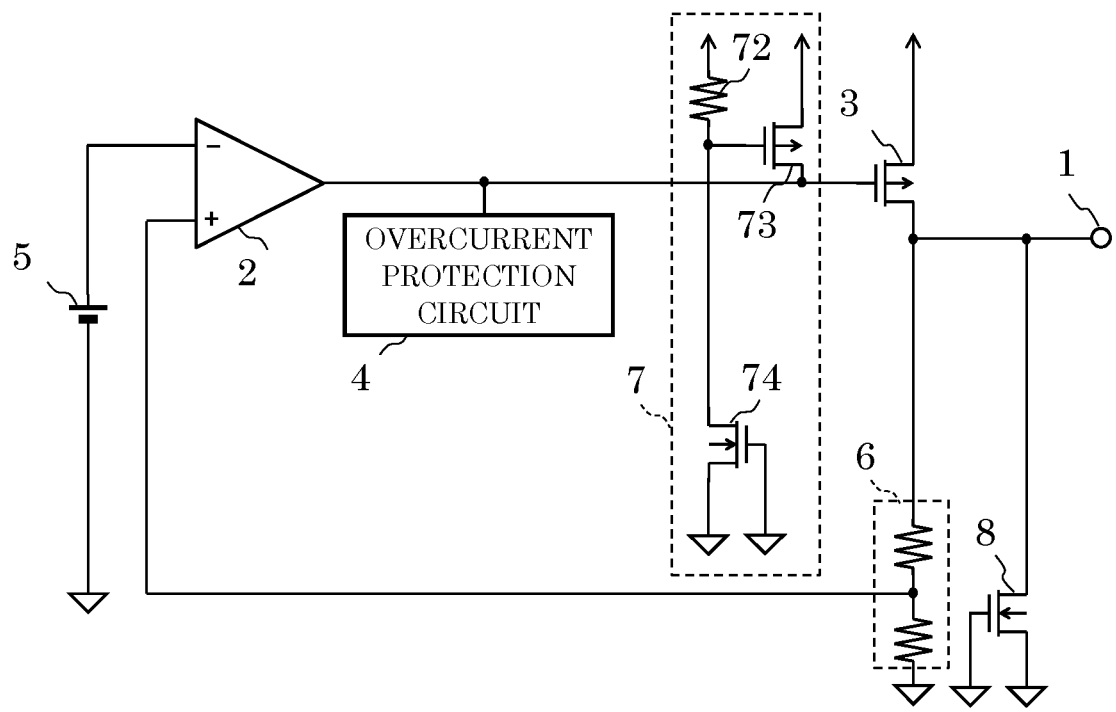
FIG. 3 is a circuit diagram illustrating another example of the voltage regulator according to the embodiment.
Figure 4:
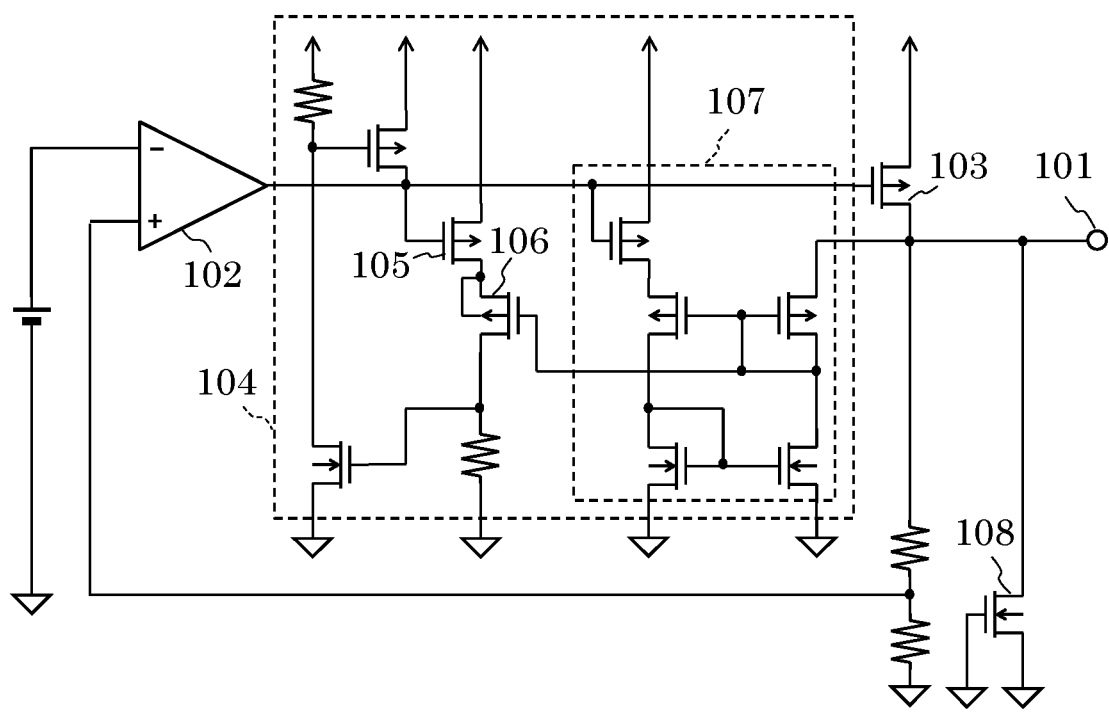
FIG. 4 is a circuit diagram illustrating a configuration of a voltage regulator in related art.
Figure 5:
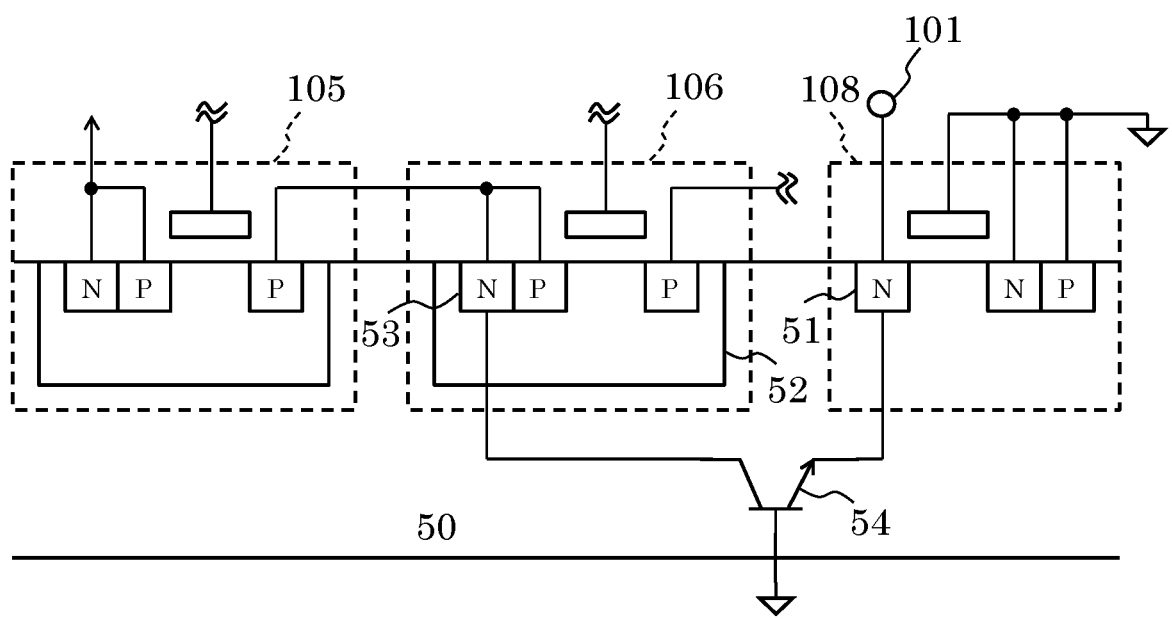
FIG. 5 is a schematic cross-sectional view of a device structure of the voltage regulator in related art.

Also, for example, since the diode 71 of the protection circuit 7 only needs to have the N-type region defined as the collector of the parasitic bipolar transistor 24, the diode 71 may be replaced with an NMOS transistor 74 as illustrated in FIG. 3. Further, the N-type region is not necessarily the N-type region of the protection circuit 7. Furthermore, although the base of the parasitic bipolar transistor 24 has been described as the P-type substrate 20, the base may be a P-type region having a structure different from that of the P-type substrate.

Besides, for example, although the voltage regulator according to the present embodiment has the configuration of supplying the feedback voltage obtained by dividing the output voltage Vout by the resistance circuit 6, the voltage regulator may have a configuration of receiving the output voltage Vout at the input terminal of the error amplifier circuit 2.

What is claimed is:
1. A voltage regulator, comprising:
an error amplifier circuit configured to control a gate voltage of an output transistor with a voltage obtained by amplifying a difference between a voltage based on an output voltage supplied to an output terminal from the output transistor and a reference voltage;

an overcurrent protection circuit configured to detect an overcurrent of the output transistor and control the gate voltage of the output transistor to prevent the overcurrent; and a protection circuit configured to detect a negative voltage of the output terminal and control the gate voltage of the output transistor to suppress an overcurrent, the protection circuit comprising a MOS transistor configured to control the gate of the output transistor, a clamp circuit connected to a gate of the MOS transistor, a semiconductor element having an N-type region connected to the clamp circuit, and a parasitic bipolar transistor in which an N-type region connected to the output terminal serves as an emitter, a P-type substrate serves as a base, and the N-type region of the semiconductor element serves as a collector.

2. The voltage regulator according to claim 1, wherein the N-type region connected to the output terminal is an N-type region of a protection element.

3. The voltage regulator according to claim 2, wherein the clamp circuit is a resistor, a current source or a diode-connected MOS transistor.

4. The voltage regulator according to claim 3, wherein the semiconductor element having the N-type region is a diode or a transistor.

5. The voltage regulator according to claim 2, wherein the semiconductor element having the N-type region is a diode or a transistor.

6. The voltage regulator according to claim 1, wherein the clamp circuit is a resistor, a current source or a diode-connected MOS transistor.

7. The voltage regulator according to claim 1, wherein the semiconductor element having the N-type region is a diode or a transistor.

* * * * *